United States Patent
Ginsburg et al.

(10) Patent No.: US 6,924,717 B2
(45) Date of Patent: Aug. 2, 2005

(54) TAPERED ELECTRODE IN AN ACOUSTIC RESONATOR

(75) Inventors: Eyal Ginsburg, Tel-Aviv (IL); Li-Peng Wang, San Jose, CA (US); Alexander Talalyevsky, Jerusalem (IL); Eyal Bar-Sadeh, Jerusalem (IL); Doron Rubin, Givataim (IL)

(73) Assignee: Intel Corporation, Santa Clara, CA (US)

( * ) Notice: Subject to any disclaimer, the term of this patent is extended or adjusted under 35 U.S.C. 154(b) by 95 days.

(21) Appl. No.: 10/607,764

(22) Filed: Jun. 30, 2003

(65) Prior Publication Data

US 2004/0263287 A1 Dec. 30, 2004

(51) Int. Cl.⁷ .............................. H03H 9/15; H03H 9/54
(52) U.S. Cl. ...................... 333/187; 333/189; 310/312; 310/322; 310/324
(58) Field of Search ................................. 333/187, 188, 333/189; 310/312, 322, 324, 363, 365

(56) References Cited

U.S. PATENT DOCUMENTS

| | | | |
|---|---|---|---|
| 6,150,703 A | 11/2000 | Cushman et al. | |
| 6,384,697 B1 | 5/2002 | Ruby | |
| 6,424,237 B1 * | 7/2002 | Ruby et al. | 333/187 |
| 6,548,419 B2 | 4/2003 | Heo et al. | |
| 6,794,958 B2 * | 9/2004 | Philliber et al. | 333/189 |
| 2002/0121337 A1 | 9/2002 | Whatmore et al. | |
| 2002/0123177 A1 | 9/2002 | Ruby et al. | |
| 2003/0003612 A1 | 1/2003 | Lee | |
| 2003/0094431 A1 | 5/2003 | Shing et al. | |

FOREIGN PATENT DOCUMENTS

JP      2000-134061    * 12/2000   ............ H03H/9/17

* cited by examiner

*Primary Examiner*—Vibol Tan
(74) *Attorney, Agent, or Firm*—Blakely, Sokoloff, Taylor & Zafman LLP

(57) ABSTRACT

An apparatus and method to provide a tapered electrode in an acoustic resonator. A piezoelectric (PZ) layer, such as Aluminum Nitride (AlN), is formed over a bottom electrode having a tapered end. A top electrode is positioned on the PZ layer. The tapered end of the bottom electrode creates a mild topography to the under layer of the PZ material to prevent cracking in the PZ layer. The tapered end also decreases acoustic losses in the acoustic resonator because the PZ grains are highly oriented. In one embodiment, the acoustic resonator is a film bulk acoustic resonator (FBAR).

21 Claims, 4 Drawing Sheets

US 6,924,717 B2

TAPERED ELECTRODE IN AN ACOUSTIC RESONATOR

BACKGROUND OF THE INVENTION

1. Field of the Invention

The present invention relates generally to acoustic resonators and, more specifically, the present invention relates to a method and apparatus for a tapered electrode in an acoustic resonator device.

2. Background Information

Acoustic resonators are often used as filters in wireless communication devices. Common types of acoustic resonators include Semiconductor Bulk Acoustic Resonators (SBAR) and Film Bulk Acoustic Resonators (FBAR). An FBAR includes a thin film of piezoelectric (PZ) material positioned between two conductive electrodes. Generally, an air cavity is formed below the bottom electrode. Aluminum Nitride (AlN) and Zinc Oxide (ZnO) are often used as piezoelectric material.

When an electrical signal, such as a Radio Frequency (RF) signal, is applied across the FBAR, the PZ layer expands and contracts, creating a vibration. This vibration creates a mechanical energy (resonance). The fundamental resonance is observed when the thickness of the PZ layer is equivalent to half the wavelength of the input signal.

When multiple FBAR resonators are combined, they can be used to produce a passband filter or a stopband filter. An FBAR can be used as a filter since it will function as an electronic resonator when allowed to operate at its mechanical resonant frequency. FBARs resonate at GHz frequencies and are sized at the micron level, thus making them ideal for wireless communication devices.

A prior art FBAR is shown in FIG. 1. A dielectric layer 12 is formed over substrate 10. Positioned on top of dielectric 12 is a bottom electrode 14. Bottom electrode 14 has a nearly vertical edge making an abrupt end 15. Formed on top of the bottom electrode 14 is piezoelectric layer 16. Positioned on the piezoelectric layer 16 is a top electrode 18. A cavity 20 is formed in substrate 10 and dielectric 12, the top of the cavity 20 defined by bottom electrode 14.

AlN is a well-known ceramic piezoelectric material. When the AlN layer is deposited, it follows the terrain of the under layer and has a tendency to crack when layered over sharp topography. Even small steps of 500 Angstroms in the under surface may cause the AlN to crack. Referring again to FIG. 1, a crack 22 has developed due to the abrupt end 15 of the bottom electrode 14. Cracks in the PZ layer decrease device yield and thus raise the costs of FBAR production.

Also, an under layer with sharp topography affects the crystal orientation of AlN. In FIG. 1, the abrupt edge 15 has caused disorientation in grains 24 of the AlN layer. If the AlN grains are not highly oriented, then the FBAR will experience acoustic losses.

BRIEF DESCRIPTION OF THE DRAWINGS

The present invention is illustrated by way of example and not limitation in the accompanying figures.

DETAILED DESCRIPTION

Methods and apparatuses to provide a tapered electrode in an acoustic resonator are disclosed. In the following description numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments. In addition, it is appreciated that the figures provided herewith are for explanation purposes to persons ordinarily skilled in the art and that the drawings are not necessarily drawn to scale.

Figure 1:
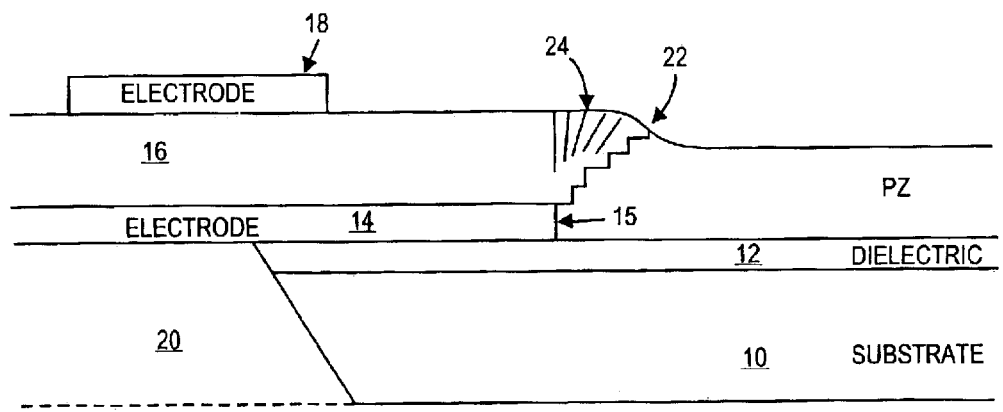
FIG. 1 is a cross-sectional view diagram illustrating a prior art FBAR.
Figure 2:
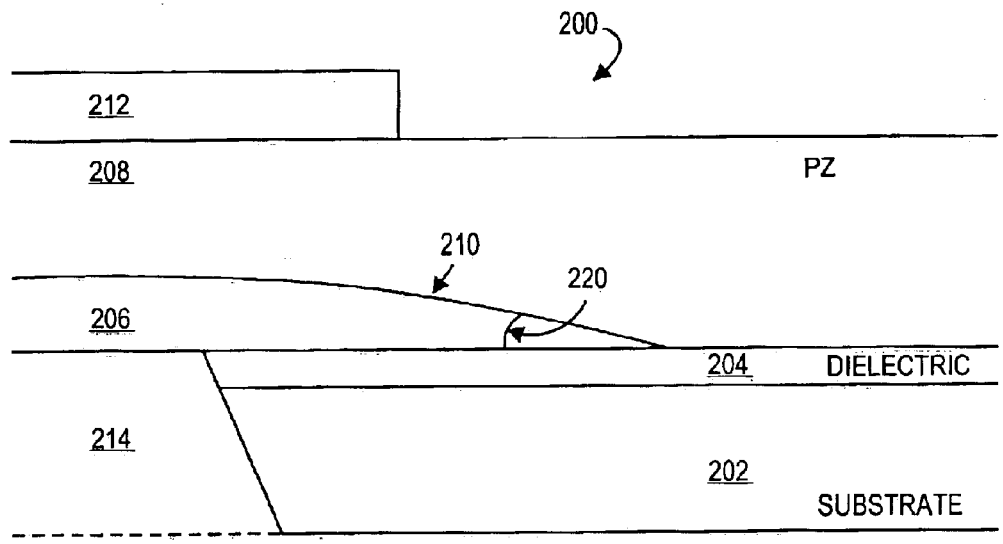
FIG. 2 is a cross-sectional view diagram illustrating one embodiment of a tapered electrode of an acoustic resonator in accordance with the teachings of the present invention.

Referring to FIG. 2, an acoustic resonator 200 according to one embodiment of the present invention is shown. The acoustic resonator 200 includes, but is not limited to, a Film Bulk Acoustic Resonator (FBAR), a Surface Acoustic Wave (SAW), or the like.

Formed on top of a substrate 202 is a dielectric layer 204. Substrate 202 includes, but is not limited to, Silicon (Si), Magnesium Oxide (MgO), Gallium Arsenic (GaAs), or the like. The dielectric layer 204 includes, but is not limited to, Silicon Dioxide ($SiO_2$), Silicon Nitride ($SiN_x$), or the like. In one embodiment, a portion of substrate layer 202 and dielectric layer 204 is removed to form a cavity 214. The cavity 214 may be formed by dry etching or wet etching and is created to decrease insertion loss of the acoustic resonator 200.

Positioned on top of the dielectric layer 204 is a bottom electrode 206 having a tapered end 210. Formed over the bottom electrode 206 is a piezoelectric (PZ) layer 208. PZ layer 208 includes, but is not limited to, Aluminum Nitride (AlN), Zinc Oxide (ZnO), lead titanate zirconate (PZT), lead scandium tantalum oxide, bismuth sodium titanium oxide, or the like. In an acoustic resonator using AlN, the AlN can be deposited by a Physical Vapour Deposition (PVD) reactive sputtering technique. A top electrode 212 is positioned on the PZ layer 208. Thus, at least a portion of PZ layer 208 is sandwiched between bottom electrode 206 and top electrode 212. The electrodes 206 and 212 connect electrical signals to the acoustic resonator 200. Bottom electrode 206 and top electrode 212 each include, but are not limited to, aluminum (Al), chromium (Cr), gold (Au), platinum (Pt), molybdenum (Mo), or the like, or any combination thereof.

As described above, bottom electrode 206 includes tapered end 210. The bottom side of bottom electrode 206 remains generally flat. The upper side of bottom electrode 206 gently slopes downward to create the tapered end 210.

In one embodiment, an angle 220 of the tapered end 210 may be between approximately five (5) degrees and thirty (30) degrees. The angle 220 of the tapered end 210 may vary along the length of the bottom electrode 206 and does not have to be the same number of degrees along the entire length of the tapered end 210. The slope of the tapered end 210 is adjusted with respect to the thickness and stress of the PZ layer 208. In one embodiment, the tapered end 210 forms angle 220 of 6.7 degrees. The thickness of the PZ layer is designed to achieve the desired resonator frequency. Generally, the higher the resonator frequency, the less the thickness of the PZ layer. In one embodiment, the height of the bottom electrode 206 is approximately 53 nanometers (nm) at its thickest point and the height of a PZ layer of AlN is approximately 2,657 nm. It will be understood that the bottom electrode 206 is not limited to the representation as shown in FIG. 2. The tapered end 210 is formed in order to prevent cracking and discontinuity in the PZ layer as well as to maintain highly oriented grains in the PZ material.

Figure 3:
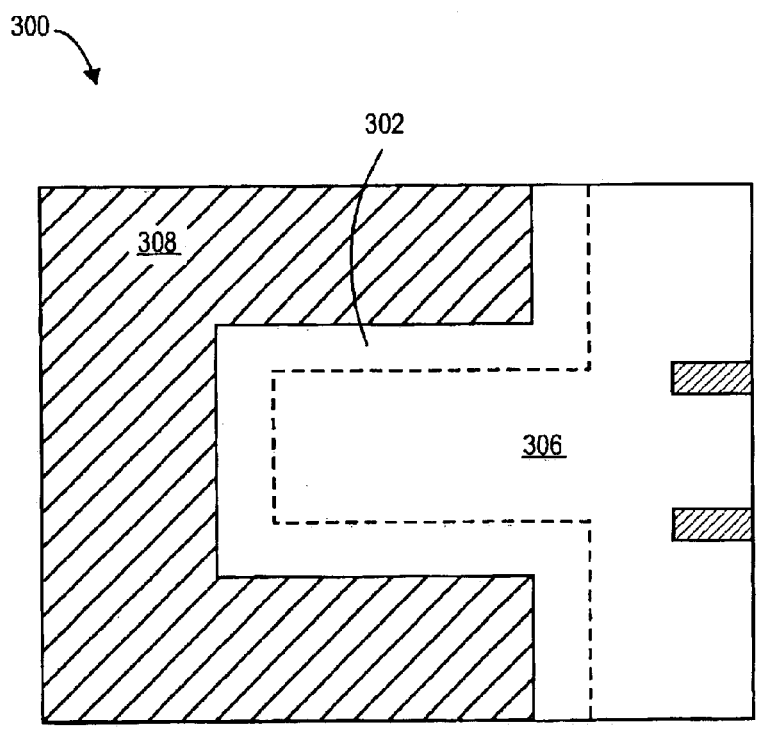
FIG. 3 is a bottom view diagram illustrating one embodiment of a tapered electrode of an acoustic resonator in accordance with the teachings of the present invention.

FIG. 3 is a bottom view diagram of an acoustic resonator 300 in accordance with one embodiment of the present invention. The acoustic resonator 300 includes a bottom electrode 306 and a PZ layer 308. Bottom electrode 306 and PZ layer 308 are similar to bottom electrode 206 and PZ layer 208 as described above in conjunction with FIG. 2. In one embodiment, the material used for PZ layer 308 is AlN. A substrate layer and a dielectric layer are not shown in FIG. 3 for clarity. PZ layer 308 fills the complete parameter of FIG. 3 and a portion of the PZ layer 308 is hidden from view by bottom electrode 306.

Bottom electrode 306 includes a tapered end 302. The tapered end 302 is shown generally as the broken line around a portion of the parameter of bottom electrode 306. Bottom electrode 306 is thickest at its center and becomes thinner while moving toward its outer edges. This mild topography of the bottom electrode 306 will prevent cracking and cause highly orientated grains in PZ layer 308. In one embodiment, bottom electrode 306 slopes across its entire surface so that the thickest portion is in the center of the bottom electrode 306 and the thinnest portions are at the outer edges. In another embodiment, the bottom electrode is of uniform thickness except at the tapered end 302 where the bottom electrode 306 begins to slope downward.

Using a tapered electrode in an acoustic resonator offers several advantages. When a PZ layer is formed, it follows the topography of the layer it is formed upon. Eliminating cracks and discontinuity in the PZ layer increases the die yield of acoustic resonators and reduces the costs of production. The tapered electrode has resulted in die yield improvement of 15–80% based on PZ layer cracking. Also, providing a mild topography below a layer of piezoelectric material decreases the acoustic losses because the grains of the PZ material will be highly oriented in the same direction.

Figure 4A:
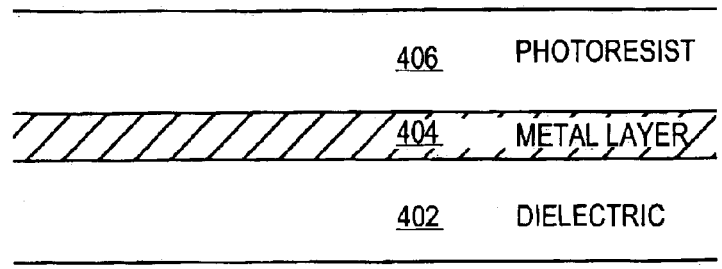
FIGS. 4A and 4B are cross-sectional diagrams illustrating one embodiment of constructing a tapered electrode in accordance with the teachings of the present invention.
Figure 4B:
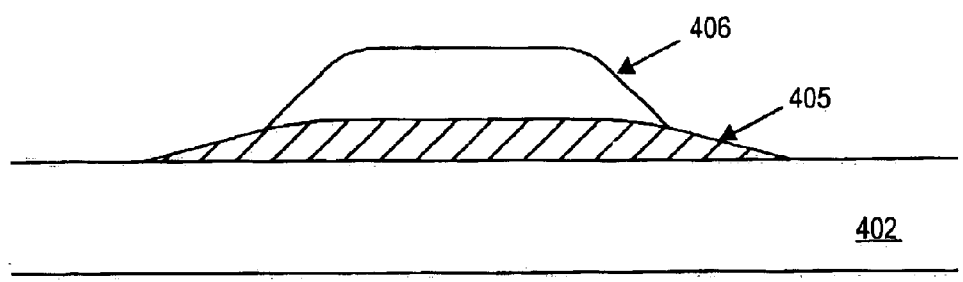

FIGS. 4A–4B illustrate one embodiment of a method to fabricate a tapered electrode. FIG. 4A shows acoustic resonator fabrication prior to the etching phase. A metal layer 404 has been applied to a dielectric layer 402. A photoresist layer 406 has been applied to metal layer 404. In one embodiment, the metal layer 404 is aluminum. A mask (not shown) has been placed on photoresist layer 406 and the photoresist layer 406 has been exposed and the exposed photoresist removed by developer. At this point, the etching process may begin.

In FIG. 4B, an etching process has been performed to create a tapered electrode 405 from metal layer 404. In one embodiment, the tapered electrode 405 is created through a dry etching technique. In another embodiment, a standard developer solution is used in a wet etching process to gently etch the tapered electrode 405. The developer initially defines the exposed and unexposed areas of the photoresist layer 406. As time passes, the developer starts to consume the photoresist layer, particularly on the line edges. Continuing to add developer creates a tapered electrode 405 and leaves dielectric 402 intact. The wet etch is isotropic such that there is a different etch rate between the metal layer 404 and the photoresist layer 406. The developer etches unexposed positive photoresist of the photoresist layer 406 faster than the metal layer 404. The photoresist layer 406 is reduced isotropically with time, thus, part of the metal layer 404, mostly at the edges, is also affected by the developer. The remaining photoresist layer 406 is then stripped by methods well known in the art. An acoustic resonator is then fabricated that includes tapered electrode 405.

Figure 5:
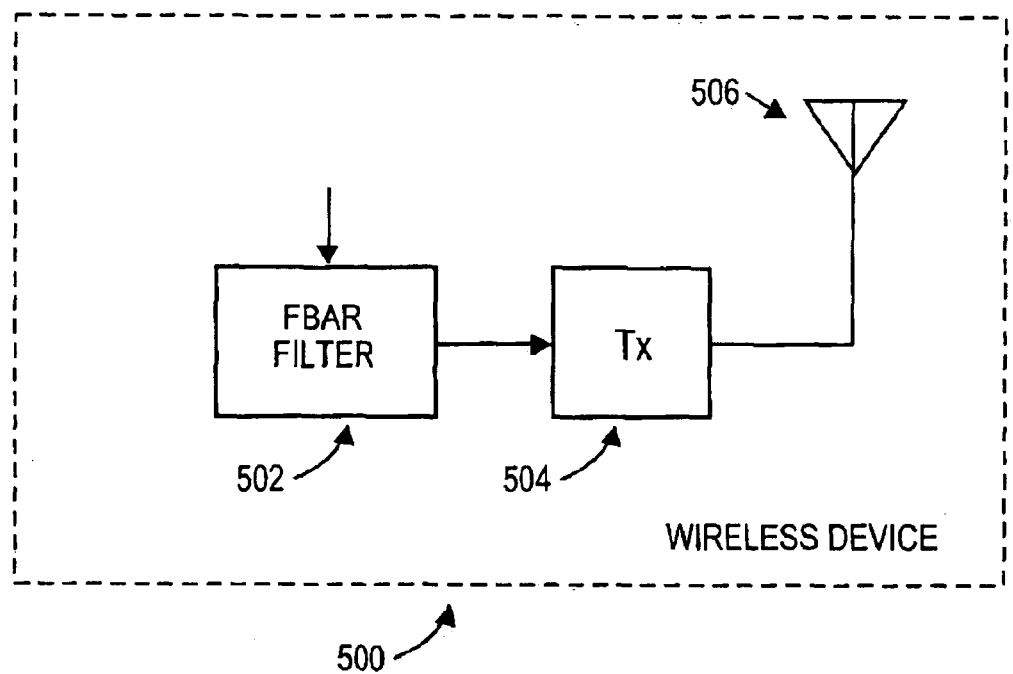
FIG. 5 is a diagram illustrating one embodiment of a wireless device in accordance with the teachings of the present invention.

FIG. 5 shows a wireless device 500 according to one embodiment of the present invention. The wireless device 500 includes, but is not limited to, a wireless phone, a wireless computer network connection, a personal digital assistant (PDA) with a wireless connection, or the like. The wireless device 500 includes a FBAR filter 502 coupled to a transmitter 504. The FBAR filter 502 includes at least one FBAR device with a tapered electrode as described above. The transmitter 504 is coupled to an antenna 506. The FBAR filter 502 receives an input signal to be transmitted by the wireless device 500. The FBAR filter 502 filters the input signal and outputs an output signal to transmitter 504. The transmitter 504 amplifies the output signal and then sends the output signal to the antennae 506.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An apparatus, comprising:

an electrode including a tapered end, wherein the tapered end has an angle between approximately five and thirty degrees; and a piezoelectric material of an acoustic resonator disposed over the electrode.

2. The apparatus of claim 1 wherein the piezoelectric material comprises Aluminum Nitride (AlN), Zinc Oxide (ZnO), or lead titanate zirconate (PZT).

3. The apparatus of claim 1 wherein the electrode comprises at least one of aluminum, gold, chromium, platinum and molybdenum.

4. The apparatus of claim 1, further comprising a top electrode adjacent to a second side of the piezoelectric material, wherein the electrode is a bottom electrode adjacent to a first side of the piezo electric material.

5. The apparatus of claim 4, further comprising a substrate layer under the bottom electrode.

6. The apparatus of claim 5, further comprising a dielectric layer between the substrate layer and the bottom electrode.

7. The apparatus of claim 1 wherein the tapered end is formed through a wet etching process.

8. The apparatus of claim 1 wherein the acoustic resonator is a film bulk acoustic resonator (FBAR).

9. A film bulk acoustic resonator (FBAR), comprising:

a bottom electrode including a tapered end;

a piezoelectric layer layered on the bottom electrode, wherein a surface area of the bottom electrode is less than a surface area of the piezoelectric layer; and a top electrode positioned on top of the piezoelectric layer wherein at least a portion of the piezoelectric layer is disposed between the bottom electrode and the top electrode.

10. The FBAR of claim 9, further comprising a substrate positioned under the bottom electrode.

11. The FBAR of claim 9 wherein the tapered end has an angle between approximately five and thirty degrees between a flat bottom side of the tapered end and a sloped upper side of the tapered end.

12. The FBAR of claim 9 wherein at least a portion of a parameter of the bottom electrode includes the tapered end.

13. A method, comprising:

forming a metal layer on top of a dielectric layer;

placing a photoresist layer on top of the metal layer; and shaping the metal layer to form a tapered electrode of an acoustic resonator, wherein shaping the metal layer comprises wet etching the metal layer to form the tapered electrode.

14. The method of claim 13 wherein the tapered electrode has an angle between approximately five and thirty degrees.

15. An apparatus, comprising:

a piezoelectric layer of an acoustic resonator; and means for preventing cracks in the piezoelectric layer, wherein the means for preventing cracks comprises a bottom electrode including a tapered end positioned under the piezoelectric layer.

16. The apparatus of claim 15 wherein the tapered end has an angle between approximately five and thirty degrees.

17. The apparatus of claim 15 wherein the acoustic resonator is a film bulk acoustic resonator (FBAR).

18. The apparatus of claim 17 wherein the piezoelectric layer comprises Aluminum Nitride (AlN), Zinc Oxide (ZnO), or lead titanate zirconate (PZT).

19. A system, comprising:

a film bulk acoustic resonator (FBAR) filter, comprising:

a bottom electrode including a tapered end, wherein the tapered end has an angle between approximately five and thirty degrees; and a piezoelectric material layered on the bottom electrode; and a transmitter electrically coupled to the FBAR filter.

20. The system of claim 19 wherein the piezoelectric material comprises Aluminum Nitride (AlN), Zinc Oxide (ZnO), or lead titanate zirconate (PZT).

21. The system of claim 19 wherein the system is a wireless device.

* * * * *